United States Patent [19]

Hongu et al.

[11] 4,370,676
[45] Jan. 25, 1983

[54] CARRIER REGENERATING CIRCUIT FOR A SYNCHRONOUS DETECTOR

[75] Inventors: Masayuki Hongu, Kawasaki; Shigeru Omuro, Higashimine; Hiroyuki Kita, Yokosuka; Masaharu Tokuhara, Tokyo, all of Japan

[73] Assignee: Sony Corporation, Tokyo, Japan

[21] Appl. No.: 277,739

[22] Filed: Jun. 26, 1981

[30] Foreign Application Priority Data

Jul. 3, 1980 [JP]   Japan ............................. 55-90990

[51] Int. Cl.³ .......................... H04N 5/44; H03D 3/18
[52] U.S. Cl. ...................................... 358/188; 329/50; 455/204
[58] Field of Search ........................ 358/188, 25, 160; 329/50, 101; 455/203, 204, 337, 201; 375/77

[56] References Cited

U.S. PATENT DOCUMENTS 3,697,685 10/1972 Lunn ................................. 350/188
4,163,196 7/1979 Hongu et al. ..................... 329/50
4,234,963 11/1980 Hongu et al. ..................... 455/204

*Primary Examiner*—John C. Martin

*Attorney, Agent, or Firm*—Lewis H. Eslinger; Alvin Sinderbrand

[57] ABSTRACT

A synchronous detector for detecting an information signal modulated onto a carrier, such as a video IF signal, is disclosed in which there are provided a circuit for supplying the modulated information signal in the form of a vestigial sideband signal, a filter circuit coupled to the supplying circuit which includes a tuning circuit tuned to the frequency of the carrier on which the information signal is modulated, an emitter follower circuit connected to the output of the filter circuit, a limiter circuit connected to the filter circuit, for producing a switching carrier, and a multiplier having first and second input terminals coupled to the output of the limiter circuit and to the supplying circuit, for multiplying the modulated information signal and the switching carrier to obtain said information signal. In one embodiment, the limiter circuit includes a differential amplifier having first and second transistors, base electrodes of which are connected to the emitter follower circuit, and third and fourth common base transistors, emitter electrodes of which are respectively connected to collector electrodes of the first and second transistors and collector electrodes of which provide output terminals for supplying the switching carrier.

7 Claims, 5 Drawing Figures

CARRIER REGENERATING CIRCUIT FOR A SYNCHRONOUS DETECTOR

BACKGROUND OF THE INVENTION

1. Field of the Invention

The present invention relates generally to a synchronous detector, and is directed more particularly to a synchronous detector adapted to detect an information signal modulated on a carrier which is simple in construction and improved in operating characteristics.

2. Description of the Prior Art

In general, as a video detector system of a television receiver, there has been proposed a so-called synchronous detecting system in which an IF (intermediate frequency) carrier signal extracted from a VIF (video intermediate frequency) signal is used to directly switch the VIF signal.

A prior art synchronous detector circuit will be now described with reference to FIG. 1. In the example of FIG. 1, the signal from an antenna 1 is fed to a tuning circuit 2 in which a VIF signal is derived from a desired broadcast wave. This VIF signal is fed through a band pass filter 3 to a VIF signal amplifier 4, and the output therefrom is fed to a multiplier circuit 5 which forms the synchronous detector circuit. The output from the amplifier 4 is also supplied to a band pass filter 6 with a frequency of 58.75 MHz, for example, for extracting the video intermediate carrier wave. The signal from the band pass filter 6 is applied through a limiter circuit 7 to the multiplier circuit 5. The synchronously detected video signal from the multiplier circuit 5 is delivered to an output terminal 8.

A video intermediate frequency carrier extracting circuit, which is made by combining the band pass filter 6 and the limiter circuit 7, may be as shown in FIG. 2. In the example of FIG. 2, the output terminals of the amplifier 4, from which VIF signals opposite in phase are derived, are respectively connected to the bases of NPN transistors 11a and 11b connected differentially. The emitters of the transistors 11a and 11b are connected together to ground through a constant current source 12. The limiter circuit 7, which consists of diodes 13a and 13b connected in opposite directions, and the band pass filter 6, which is formed of a capacitor 14 and a coil 15 in parallel, are connected between the collectors of the transistors 11a and 11b. The collectors thereof are also connected through respective resistors 16a and 16b to a power source terminal 17. Accordingly, the carrier of the VIF signal can be extracted across the collectors of the transistors 11a and 11b.

The carrier thus extracted from the collectors of the transistors 11a and 11b is supplied through transistors 21a and 21b, each being in an emitter follower configuration, to the bases of two sets of transistor differential circuits 22a and 22b which form the multiplier circuit 5. The connection points between the emitters of the two sets of transistor differential circuits 22a and 22b are respectively grounded through a transistor 23a and a constant current source 24, and through a transistor 23b and a constant current source 24b. The emitters of the transistors 23a and 23b are connected to each other through a resistor 25, and the VIF signals opposite in phase from the amplifier 4 are fed to the bases of the transistors 23a and 23b. In FIG. 2, reference numeral 26 represents the power source terminal for this circuit.

According to the circuit shown in FIG. 2, the synchronously detected video signals are derived at the collectors of the transistor differential circuits 22a and 22b and then delivered to output terminals 8a and 8b.

In the circuit of FIG. 2, since the diodes 13a and 13b, forming the limiter circuit 7, are connected in parallel with the bandpass filter 6, the Q of the bandpass filter 6 is lowered and hence the extracted carrier is deteriorated in purity. As a result, the interference characteristics (cross-color, 920 KH$_z$ beat and so on) upon the synchronous detection is deteriorated.

FIG. 3 shows a circuit which was previously proposed by the applicant same as that of this application so as to avoid the above defect. In this circuit, the output terminals of the amplifier 4 are respectively connected through resistors 31a and 31b to the bases of emitter follower transistors 32a and 32b, and the bandpass filter 6 is connected between the bases of the transistors 32a and 32b. The collectors thereof are connected together to the power source terminal 26. The emitters of transistors 32a and 32b are respectively grounded through constant current sources 34a and 34b and also connected to the bases of transistors 35a and 35b which are connected differentially to form a limiter amplifier. The transistors 35a and 35b have the emitters connected together to the ground through a constant current source 36 and the collectors connected together through resistors 37a and 37b to a power source terminal 38. With the circuit of FIG. 3, the carrier of the VIF signal are extracted across the collectors of the transistors 35a and 35b.

According to the previously proposed circuit shown in FIG. 3, since one band pass filter 6 is connected through the emitter follower transistors 32a and 32b to the transistors 35a and 35b forming the limiter amplifier, the Q of the band pass filter 6 can be made high and hence the carrier high in purity can be extracted.

With the circuit of FIG. 3, however, there is generated bad influence on the bases of transistors 35a and 35b by the mirror capacity and hence the phase characteristic of the output signal is deteriorated.

In detail, since there exists the collector-base capacity in each of the transistors 35a and 35b, a model shown in FIG. 4 is considered and then an input impedance Zin is calculated.

From FIG. 4, the following expressions (1) to (3) are derived.

$$v_i \simeq i_b \cdot h_{fe} \cdot Z_e \tag{1}$$

$$v_o = \frac{Z_L}{Z_E} \cdot v_i + i_f \cdot Z_L$$

$$= G_v \cdot v_i + i_f \cdot Z_L \tag{2}$$

$$v_i - v_o = i_f \cdot Z_f \tag{3}$$

where $G_v$ is the voltage gain of the transistor.

From the equafollowing equation (4) is derived.

$$v_i - (G_v v_i + i_f Z_L) = i_f Z_f \therefore (1 - G_v)v_i = i_f(Z_L + Z_f) \tag{4}$$

Since the following equation (5) is taken to be established, $$i_i = i_b + i_f \tag{5}$$

the following equation (6) is obtained by substituting the equations (1) and (4) to the equation (5)

$$i_i = \frac{v_i}{h_{fe} \cdot Z_E} = \frac{(1-G_v)v_i}{Z_L + Z_f} \quad (6)$$

From the above equation (6), the input impedance Zin can be expressed as follows:

$$Zin = \frac{v_i}{i_i} \quad (7)$$

$$= \frac{1}{\frac{1}{h_{fe} \cdot Z_e} + \frac{(1-G_v)}{Z_L + Z_f}}$$

If it is assumed that $h_{fe} \cdot Z_E = \infty$, the input inpedance Zin is expressed as follows:

$$i_i \simeq i_f \quad (8)$$

$$\therefore Zin \simeq \frac{v_i}{i_f}$$

$$\simeq \frac{Z_L + Z_f}{1 - G_v}$$

$$\simeq \frac{Z_f}{-G_v} \quad (\because Z_f >> Z_L)$$

Further, if it is assumed that $Z_f = 1/(j\omega C)$, the input impedance Zin is expressed as follows:

$$Zin \simeq -\frac{Z_f}{G_v} \quad (9)$$

$$\simeq -\frac{1}{j\omega G_v \cdot C}$$

In this case, the value of $G_v \cdot C$ is the mirror capacity, and the mirror capacity varies dependent on the voltage gain $G_v$ while $G_v$ varies dependent on the level of the input signal. Therefore, the mirror capacity is varied in response to the level of the input signal. Due to the variation of the mirror capacity, the phase of the output signal is varied and hence the phase characteristic of the circuit is deteriorated.

OBJECTS AND SUMMARY OF THE INVENTION

Accordingly, an object of the present invention is to provided a synchronous detector free from the defect encountered in the prior art.

Another object of the invention is to provide a synchronous detector which is simple in construction but superior in phase characteristics.

According to an aspect of the present invention there is provided a synchronous detector for detecting an information signal modulated onto a carrier, such as a video IF signal, which comprises:
  means for supplying said modulated information signal to said detector in the form of a vestigial sideband signal;
  filter means coupled to said supplying means, said filter means including a tuned circuit tuned to the frequency of the carrier on which said information signal is modulated;
  emitter follower means connected to the output of said filter means;
  limiter means including a differential amplifier having first and second transistors, base electrodes of which being connected to the output of said emitter follower means, and third and fourth transistors, base electrodes of which are connected together, and emitter electrodes of which are respectively connected to collector electrodes of said first and second transistors, collector electrodes of said third and fourth transistors being output terminal means for providing a switching carrier; and
  multiplier means having first and second input terminals respectively coupled to said output terminal means of said limiter means and to said supplying means, for multiplying said modulated information signal and said switching carrier to obtain said information signal.

The other objects, features and advantages of the present invention will be apparent from the following description taken in conjunction with the accompanying drawings in which the like references designate like circuit elements.

DESCRIPTION OF THE PREFERRED EMBODIMENT

The present invention will be hereinafter described with reference to the drawings.

Figure 1:
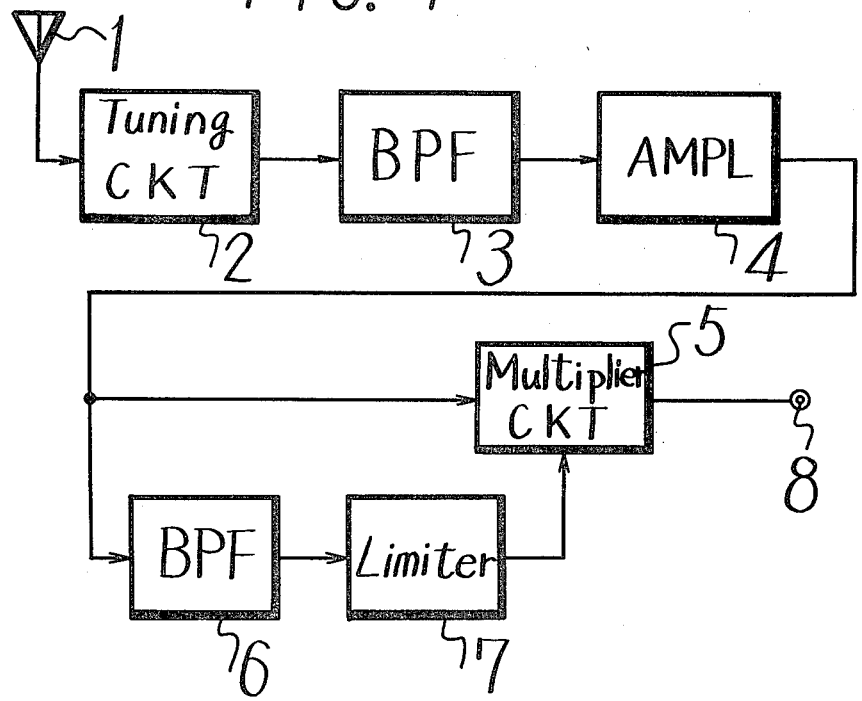
FIG. 1 is a block diagram showing a synchronous detector circuit used to explain the present invention.
Figure 4:
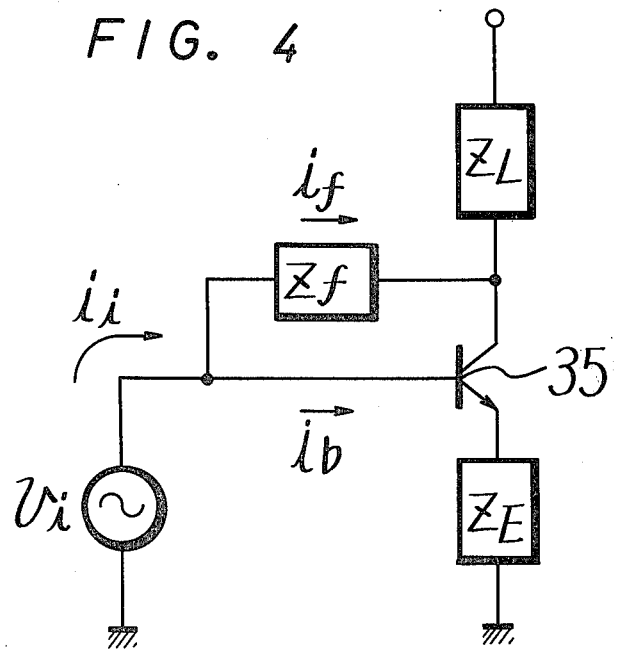
FIG. 4 is a circuit model diagram used to explain the circuit of FIG. 3.
Figure 2:
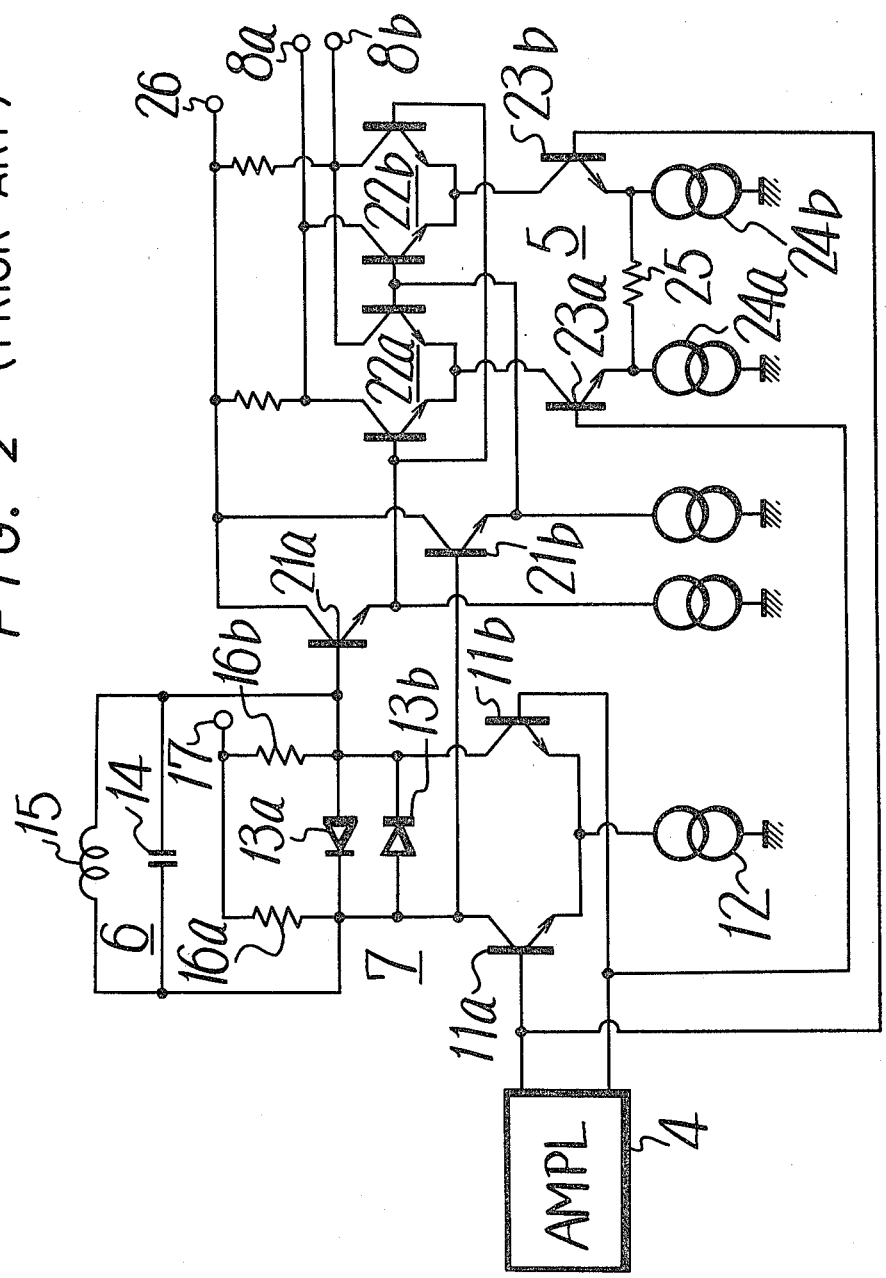
FIGS. 2 and 3 are connection diagrams each showing a prior art carrier extracting circuit.
Figure 3:
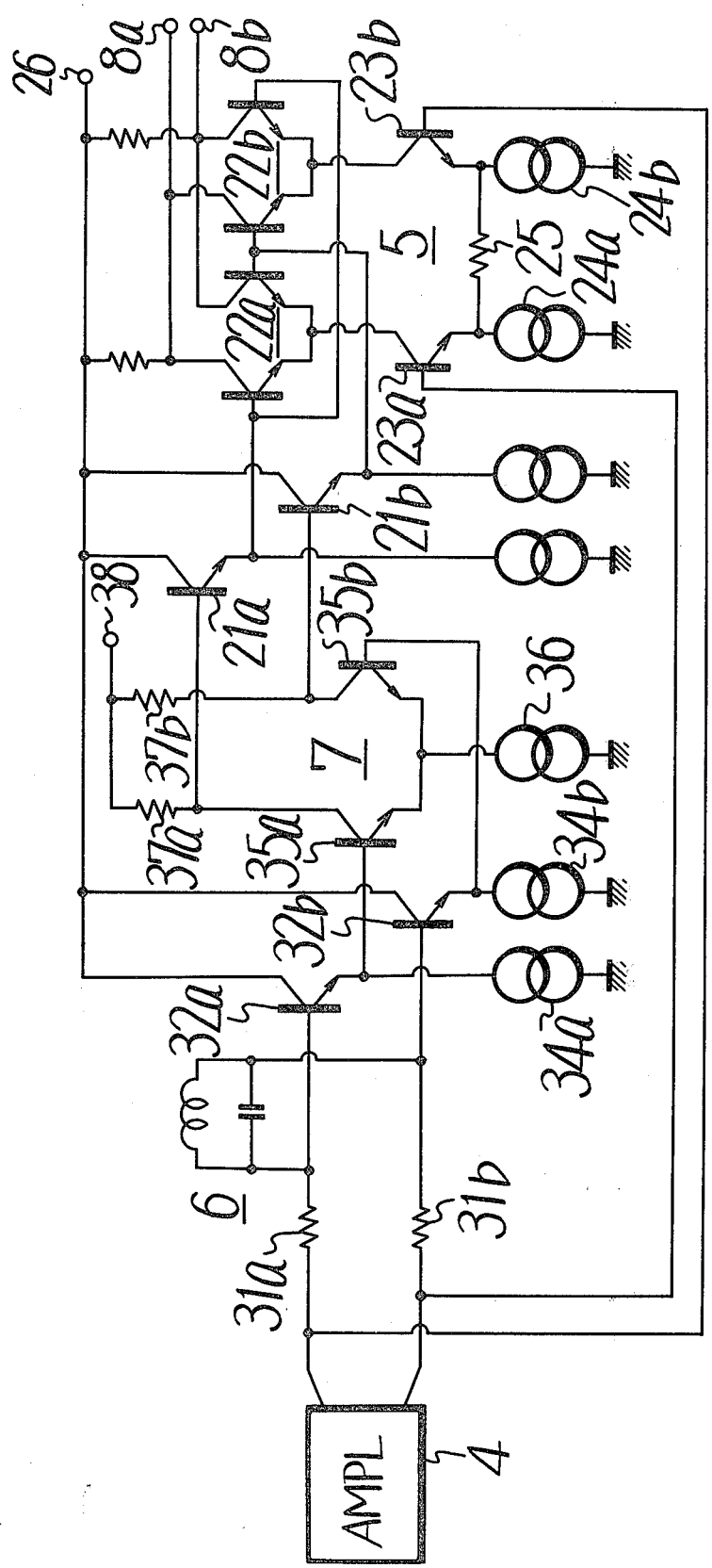
Figure 5:
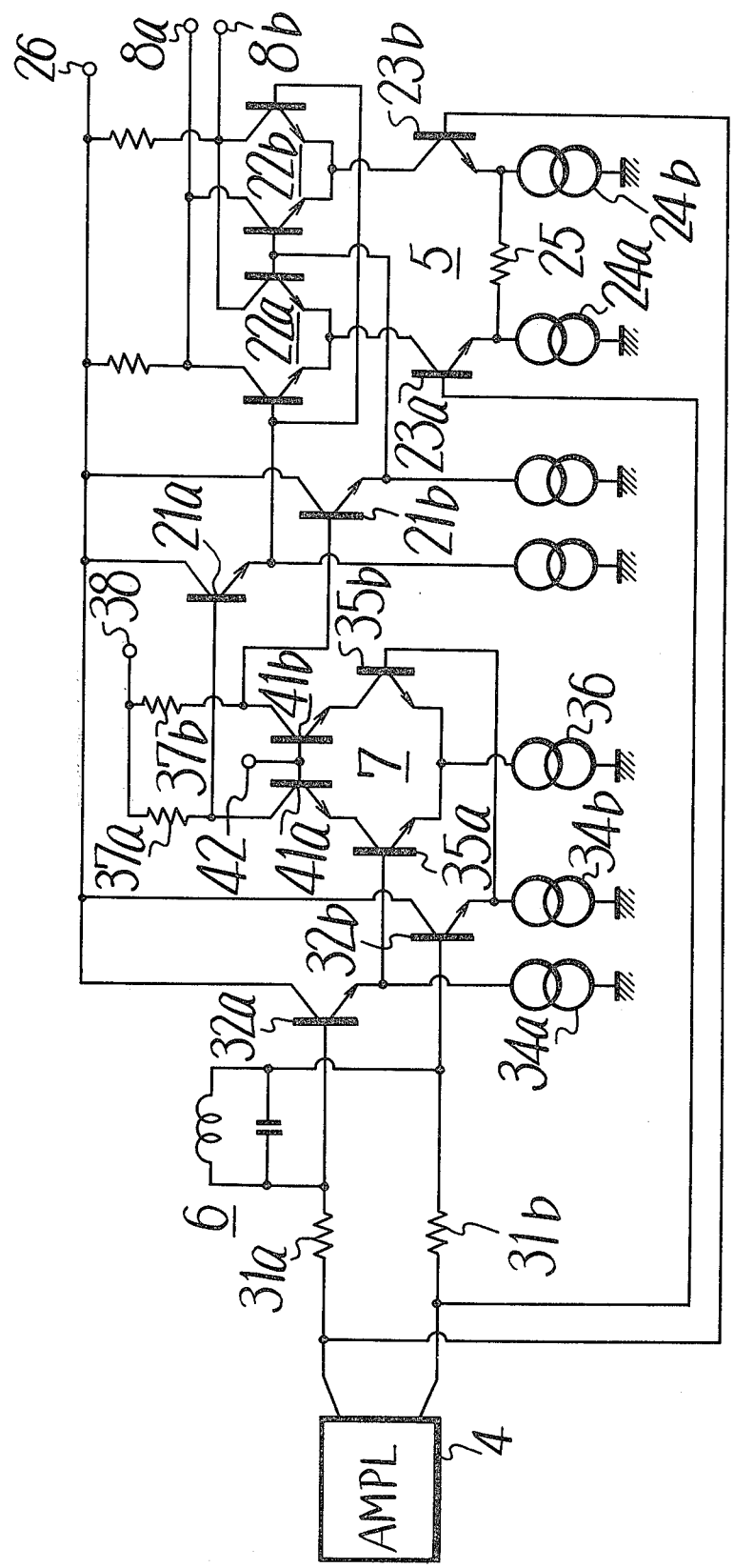
FIG. 5 is a connection diagram showing an example of the carrier extracting circuit according to the present invention which is used in the synchronous detector circuit shown in FIG. 1.

FIG. 5 shows an example of the carrier extracting circuit according to the present invention. Though not shown in FIG. 5, the parts at the input side of the VIF amplifier 4 are substantially the same as those shown in FIG. 1. In FIG. 5, the collector-emitter paths of transistors 41a and 41b are respectively connected between the collectors of transistors 35a, 35b of the limiter amplifier 7 and resistors 37a, spectively connected to the bases of transistors 21a and 21b. The other circuit construction of the example shown in FIG. 5 is substantially same as that of FIG. 3.

In the circuit of the invention shown in FIG. 5, the transistors 41a and 41b form an amplifier of the grounded-base type. By the provision of such an amplifier, $Z_E \simeq Z_L$ is eexpression is obtained.

$$G_v = \frac{Z_L}{Z_E}$$

$$\simeq 1$$

Therefore, the input impedance Zin expressed by the equation (9) becomes constant in value.

For this reason, with the circuit of the present invention shown in FIG. 5, the phase variation caused by the mirror capacitance disappears or can be removed and hence the phase characteristics of the circuit are improved.

According to the present invention, the carrier thus extracted is high in purity and good in phase characteristics.

A multiplier circuit different from the circuit 5 shown in the drawings may be employed as well with the circuit of the invention without losing the benefits of the invention.

Although the above description has been given of a single preferred embodiment of the present invention, with reference to the accompanying drawings, it will be apparent that many modifications and variations could be effected by one skilled in the art without departing from the spirit and scope of the novel concepts of the present invention, as defined in the appended claims.

We claim as our invention:

1. A synchronous detector for detecting an information signal modulated onto a carrier, comprising:
   means for receiving said modulated information signal;
   filter means coupled to said receiving means, said filter means including a tuning circuit tuned to the frequency of said carrier;
   emitter follower means connected to the output of said filter means;
   limiter means including a differential amplifier having first and second transistors, base electrodes of which are connected to the output of said emitter follower means, and third and fourth transistors, base electrodes of which are connected together, and emitter electrodes of which are respectively connected to collector electrodes of said first and second transistors, collector electrodes of said third and fourth transistors being output terminal means for providing a switching carrier; and
   multiplier means having first and second input terminals respectively coupled to said output terminal means of said limiter means and to said receiving means, for multiplying said modulated information signal and said switching carrier to obtain said information signal.

2. The synchronous detector according to claim 1; wherein said filter means has a pass band less than the frequency spectrum of said modulated information signal for limiting the spectrum of the signal passed thereby to a double sideband signal having a center frequency substantially equal to the frequency of said carrier.

3. The synchronous detector according to claim 2; wherein said receiving means receives the output of a video IF amplifier of a television receiver; said modulated information signal comprises a video IF signal; and said carrier on which said information signal is modulated comprises an IF carrier.

4. The synchronous detector according to claim 3; wherein said video IF amplifier has a pair of output terminals to which said video IF signal is applied differentially, and said receiving means is connected across said pair of output terminals.

5. The synchronous detector according to claim 4; wherein said emitter follower means comprises a pair of emitter follower transistors having their respective base electrodes connected across said tuning circuit and having their respective emitter electrodes connected to said base electrodes of said first and second transistors of said differential amplifier.

6. A synchronous detector according to claim 1, wherein said modulated information signal is received by said receiving means in the form of a vestigial sideband signal.

7. A synchronous detector according to claim 6, wherein said filter means has a pass band less than the

* * * * *